(12) United States Patent
Tsai et al.

(10) Patent No.: US 11,189,499 B2
(45) Date of Patent: Nov. 30, 2021

(54) ATOMIC LAYER ETCH (ALE) OF TUNGSTEN OR OTHER METAL LAYERS

(71) Applicant: Tokyo Electron Limited, Tokyo (JP)

(72) Inventors: Yu-Hao Tsai, Albany, NY (US); Du Zhang, Albany, NY (US); Mingmei Wang, Albany, NY (US); Aelan Mosden, Hopewell Junction, NY (US); Matthew Flaugh, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/802,554

(22) Filed: Feb. 27, 2020

(65) Prior Publication Data

US 2020/0312673 A1    Oct. 1, 2020

Related U.S. Application Data

(60) Provisional application No. 62/825,167, filed on Mar. 28, 2019.

(51) Int. Cl.
*H01L 21/3213* (2006.01)

(52) U.S. Cl.
CPC .. *H01L 21/32138* (2013.01); *H01L 21/32136* (2013.01)

(58) Field of Classification Search
CPC .................. H01L 21/32138; H01L 21/32136
See application file for complete search history.

(56) References Cited

U.S. PATENT DOCUMENTS

2019/0189456 A1*   6/2019   Mullick ............ H01L 21/32135

* cited by examiner

*Primary Examiner* — Duy Vu N Deo
*Assistant Examiner* — Mahmoud Dahimene
(74) *Attorney, Agent, or Firm* — Rothwell, Figg, Ernst & Manbeck, P.C.

(57) ABSTRACT

Methods for the atomic layer etch (ALE) of tungsten or other metal layers are disclosed that use in part sequential oxidation and reduction of tungsten/metal layers to achieve target etch parameters. For one embodiment, a metal layer is first oxidized to form a metal oxide layer and an underlying metal layer. The metal oxide layer is then reduced to form a surface metal layer and an underlying metal oxide layer. The surface metal layer is then removed to leave the underlying metal oxide layer and the underlying metal layer. Further, the oxidizing, reducing, and removing processes can be repeated to achieve a target etch depth. In addition, a target etch rate can also achieved for each process cycle of oxidizing, reducing, and removing.

23 Claims, 6 Drawing Sheets

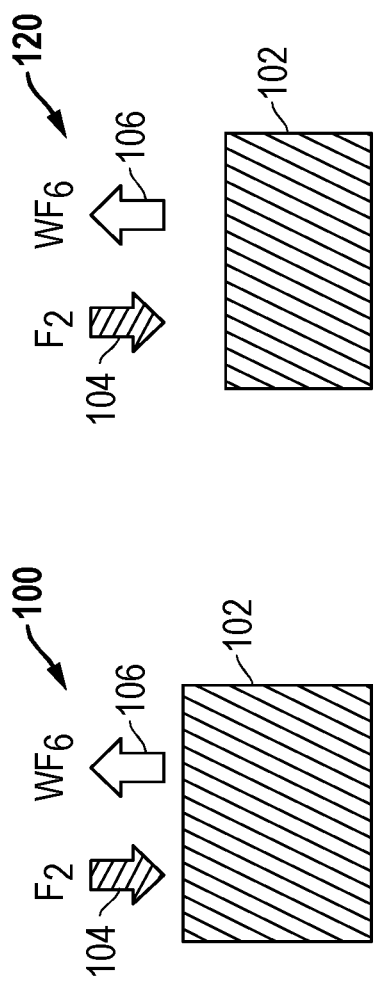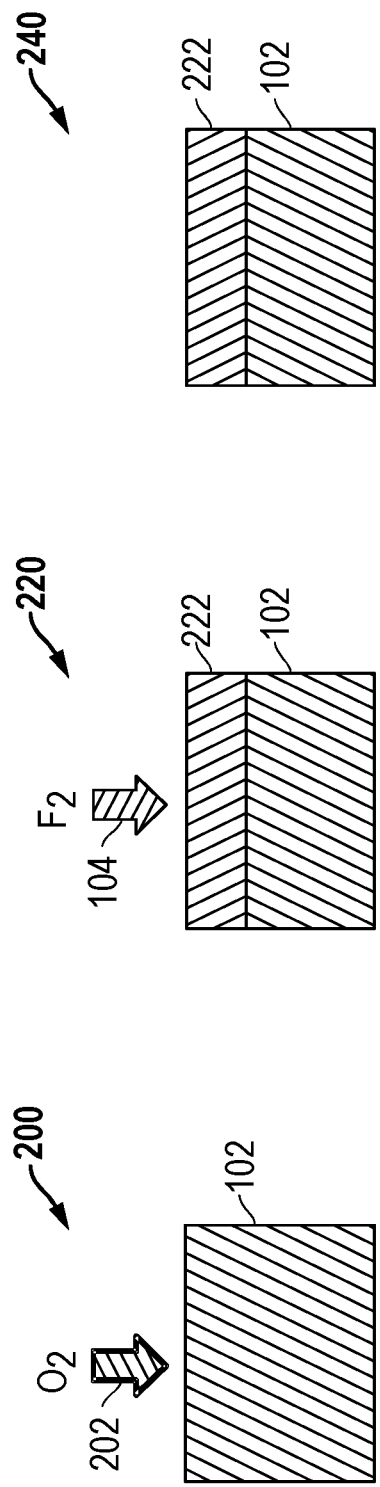

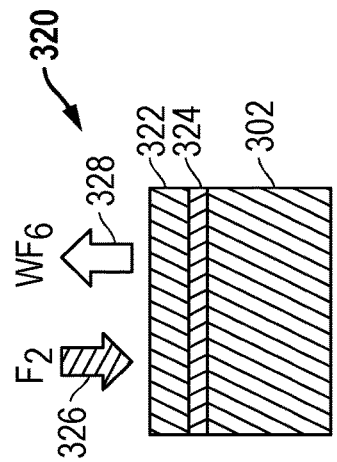
FIG. 3A
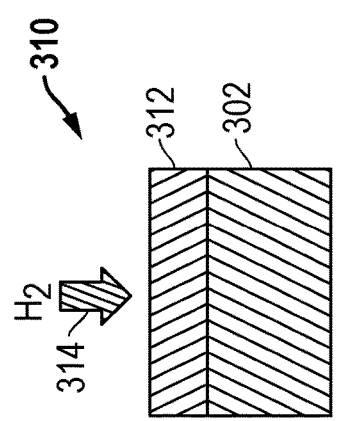
FIG. 3B
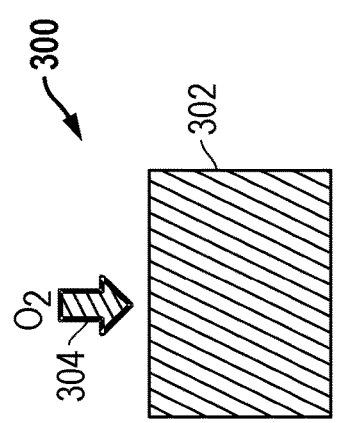
FIG. 3C
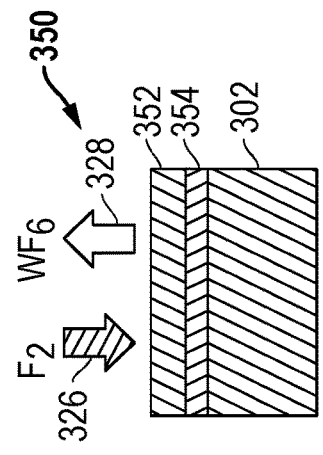
FIG. 3D
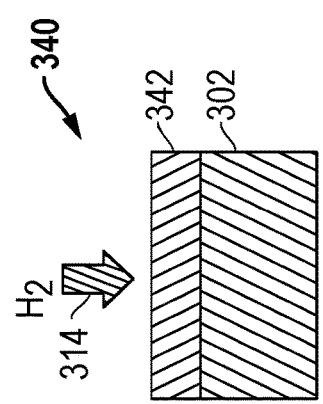
FIG. 3E
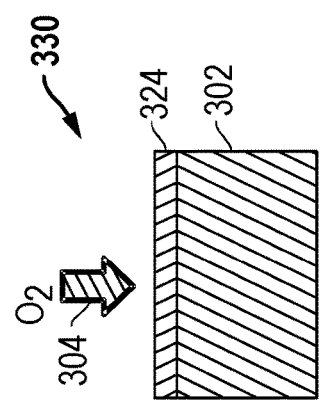
FIG. 3F
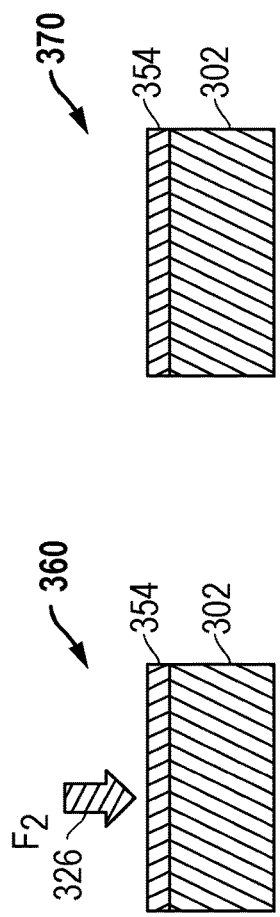
FIG. 3G
FIG. 3H

ATOMIC LAYER ETCH (ALE) OF TUNGSTEN OR OTHER METAL LAYERS

This application claims priority to U.S. Provisional Patent Application No. 62/825,167, entitled, "ATOMIC LAYER ETCH (ALE) OF TUNGSTEN OR OTHER METAL LAYERS," filed Mar. 28, 2019; the disclosure of which is expressly incorporated herein, in its entirety, by reference.

BACKGROUND

The present disclosure relates to methods for the manufacture of microelectronic workpieces including the formation of patterned structures on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes. Traditional etch processes have not adequately achieved these reduced process dimensions with respect to the etching of tungsten (W) layers or other metal layers on substrates for microelectronic workpieces.

SUMMARY

Embodiments are described herein for atomic layer etch (ALE) of tungsten or other metal layers. For disclosed embodiments, this ALE of tungsten (W) or other metal is achieved in part using sequential surface oxidation of tungsten/metal and reduction of tungsten/metal oxide. Further, the disclosed embodiments provide a self-limiting etch of tungsten/metal material layers. Different or additional features, variations, and embodiments can also be implemented, and related systems and methods can be utilized as well.

For one embodiment, a method to etch a metal layer is disclosed including oxidizing a metal layer to form a metal oxide layer and an underlying metal layer, reducing the metal oxide layer to form a surface metal layer and an underlying metal oxide layer, and removing the surface metal layer to leave the underlying metal oxide layer and the underlying metal layer.

In additional embodiments, the metal layer is formed on a substrate for a microelectronic workpiece. In further additional embodiments, the method includes oxidizing the underlying metal layer to form a metal oxide layer, and then repeating the reducing and removing steps. In further embodiments, the oxidizing, reducing, and removing steps are repeated to achieve a target etch depth. In still further embodiments, a target etch rate is achieved for each process cycle of oxidizing, reducing, and removing.

For one embodiment, a method to etch a tungsten layer is disclosed including oxidizing a tungsten layer to form a tungsten oxide layer and an underlying tungsten layer, reducing the tungsten oxide layer to form a surface tungsten layer and an underlying tungsten oxide layer, and removing the surface tungsten layer to leave the underlying tungsten oxide layer and the underlying tungsten layer.

In additional embodiments, the removing includes an etch process, and wherein the underlying tungsten layer provides an etch stop for the etch process. In further additional embodiments, the method includes oxidizing the underlying tungsten layer to increase the tungsten oxide layer, and then repeating the reducing and removing steps. In further embodiments, the oxidizing, reducing, and removing steps are repeated to achieve a target etch depth. In still further embodiments, the target etch depth is less than or equal to 20 Angstroms. In further embodiments, a target etch rate less than or equal to 10 Angstroms or a target etch rate less than or equal to 3 Angstroms is achieved for each process cycle of oxidizing, reducing, and removing.

In additional embodiments, the oxidizing includes applying a plasma including oxygen to the tungsten layer. The reducing includes applying a plasma including hydrogen to the tungsten oxide layer. And the removing includes applying a plasma including fluorine.

For one embodiment, a method of etching is disclosed including receiving a substrate having a metal layer where the metal layer includes an exposed surface treatable by a chemical environment and selectively etching the metal layer using a sequence of chemical exposures. The chemical exposure sequence includes exposing the metal layer to an oxidation chemistry to form a metal oxidation sub-layer extending beneath the exposed surface to a first target depth within the metal layer, exposing the metal layer to a reduction chemistry to reduce a portion of the metal oxidation sub-layer and form a metal reduction sub-layer extending beneath the exposed surface to a second target depth less than the first target depth, and exposing the metal layer to an etchant to fully remove the metal reduction sub-layer.

In additional embodiments, the method includes repeating the sequence of chemical exposures until a target etch depth is achieved. In further embodiments, one or more of the chemical exposures is a gas-phase exposure. In still further embodiments, all of the chemical exposures are performed in the same chamber.

In additional embodiments, the metal layer contains tungsten. In further embodiments, the metal layer consists essentially of tungsten.

In additional embodiments, the oxidation chemistry contains O, $O_2$, $O_3$, excited oxygen, meta-stable oxygen, triplet oxygen, singlet oxygen, oxygen radical, or any combination of two or more thereof. In further additional embodiments, the reduction chemistry contains H, $H_2$, excited hydrogen, meta-stable hydrogen, hydrogen radical, or any combination of two or more thereof. In still further additional embodiments, the etchant contains a F, $F_2$, another halogen, $CF_4$, $NF_3$, or any combination of two or more thereof. In further embodiments, the oxidation chemistry includes an oxygen containing plasma and the reduction chemistry includes a hydrogen containing plasma.

In additional embodiments, the method also includes controlling a first ion energy level for a first ion flux incident on the substrate during the exposure to the oxidation chemistry and controlling a second ion energy level for a second ion flux incident on the substrate during the exposure to the reduction chemistry, where the ratio of the first ion energy level to the second energy level exceeds ten.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1A-1C provide cross-section views of an example embodiment for a tungsten (W) etch where a plasma etch is applied with a process gas including fluorine ($F_2$).

FIGS. 2A-2C provide cross-section views of an example embodiment for an etch stop process where a plasma is applied with a process gas including oxygen ($O_2$) to oxidize a tungsten (W) layer.

FIGS. 3A-3H provide cross-section views of an example embodiment where atomic layer etch (ALE) of tungsten (W) is achieved through a sequential oxidation/reduction/removal process that can be repeated to achieve a desired etch depth.

DETAILED DESCRIPTION

Figure 4:
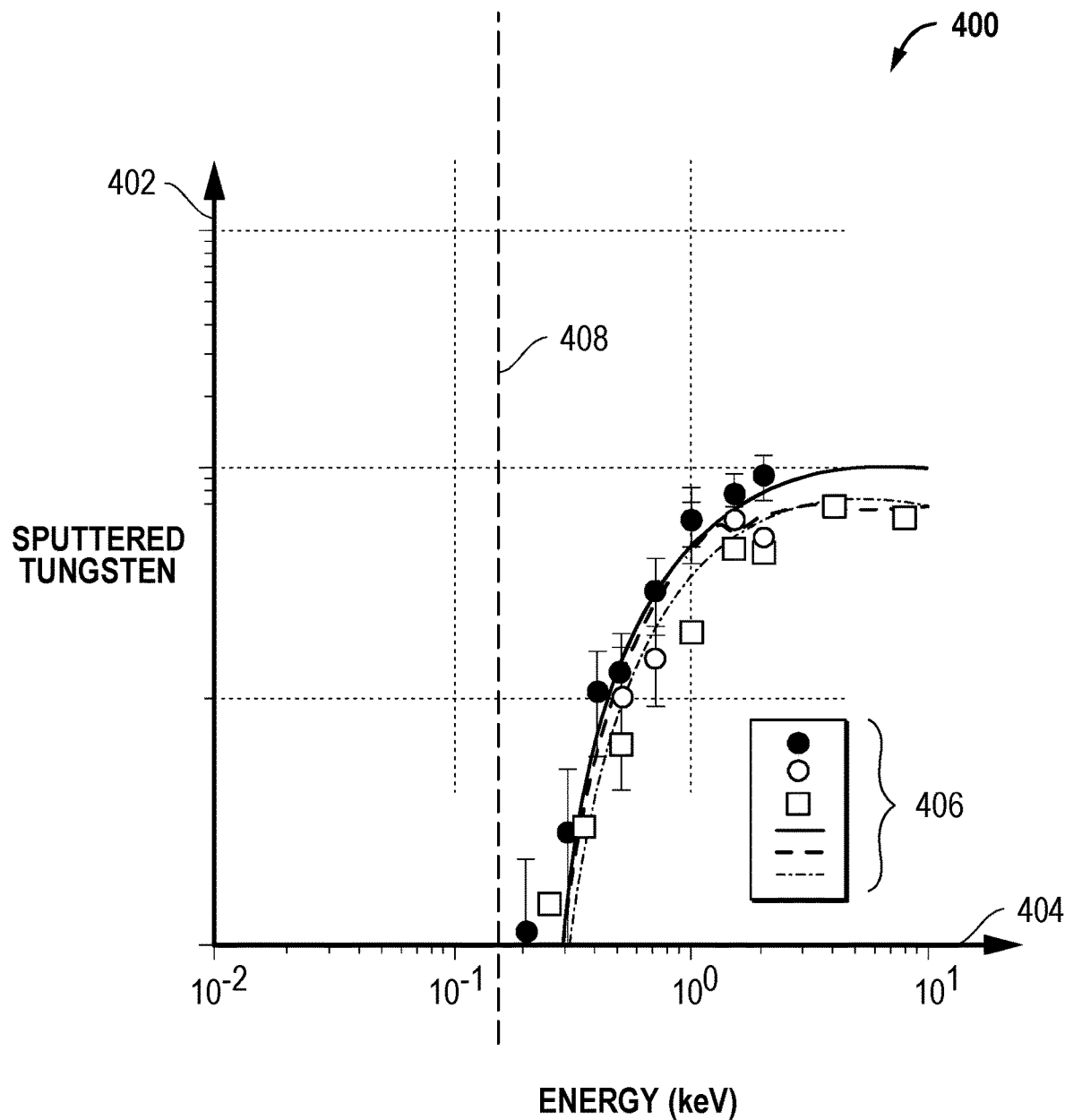
FIG. 4 provides an embodiment of representative diagrams for sputtering of tungsten (W) based upon the level of incident energy of deuterium ($H_2$ isotope).

As described herein, methods for the atomic layer etch (ALE) of tungsten or other metal layers are disclosed that use in part sequential oxidation and reduction of tungsten/metal layers to achieve target etch parameters. Applying the disclosed techniques, etching of tungsten/metal layers can be achieved with small dimensions and a well-controlled etch rate. For example, an etch rate of less than or equal to ten (10) Angstroms per cycle, and preferably less than or equal to three (3) Angstroms per cycle, can be achieved using the disclosed techniques. Other advantages and implementations can also be achieved while still taking advantage of the process techniques described herein.

FIGS. 1A-1C, 2A-2C, 3A-3E, 4, and 5A provide example embodiments for the disclosed techniques as applied to tungsten (W). It is understood that similar techniques can be applied to layers made from other metals or combinations of metals, for example, as provided in FIG. 5B. Other materials can also be included within these layers while still taking advantage of the disclosed techniques.

FIGS. 1A-1C provide cross-section views of an example embodiment for a tungsten (W) etch where a plasma etch is applied with a process gas including fluorine ($F_2$). The tungsten layer 102, for example, can be formed on a substrate for a microelectronic workpiece.

FIG. 1A provides a cross-section view of an example embodiment 100 where a fluorine plasma 104 including fluorine ($F_2$) gas is applied to the surface of a tungsten (W) layer 102. This application of fluorine plasma 104 causes a surface modification of the tungsten (W) layer 102 and produces tungsten fluoride ($WF_6$) gas 106. As such, the fluorine plasma 104 etches the tungsten (W) layer 102 to reduce its height by an etch amount based upon the length of the etch cycle.

FIG. 1B provides a cross-section view of an example embodiment 120 where a further etch cycle has been initiated. A fluorine plasma 104 including fluorine ($F_2$) gas is again applied to the surface of the remaining tungsten (W) layer 102. This application of fluorine plasma 104 again produces tungsten fluoride ($WF_6$) gas 106, and the tungsten layer (W) 102 is further etched to reduce its height by an etch amount based upon the length of the additional etch cycle.

FIG. 1C provides a cross-section view of an example embodiment 140 where a further etch cycle has been initiated. The application of fluorine plasma 104 again produces tungsten fluoride ($WF_6$) gas 106, and the tungsten layer (W) 102 is still further etched to reduce its height by an etch amount based upon the length of the additional etch cycle.

As shown in FIGS. 1A-1C, therefore, the tungsten layer (W) 102 can be etched by repeated plasma etch cycles that apply a plasma with fluorine. Further, fluorine plasma etch cycles can be repeated to etch the tungsten layer to a desired depth.

FIGS. 2A-2C provide cross-section views of an example embodiment for an etch stop process where a plasma is applied with a process gas including oxygen ($O_2$) to oxidize a tungsten (W) layer. The tungsten layer 102, for example, can be formed on a substrate for a microelectronic workpiece.

FIG. 2A provides a cross-section view of an example embodiment 200 where a plasma 202 including oxygen ($O_2$) is applied to a tungsten (W) layer 102. This application of oxygen plasma 202 causes a surface modification of the tungsten layer 102 and produces a layer of tungsten oxide ($WO_3$) at the surface of the tungsten layer 102.

FIG. 2B provides a cross-section view of an example embodiment 220 including the resulting tungsten oxide ($WO_3$) layer 222 formed on the surface of the tungsten layer 102. When a subsequent etch process is applied, such as an application of fluorine plasma 104, the tungsten oxide ($WO_3$) layer 224 inhibits or entirely restricts any etching of the remaining portion of the underlying tungsten (W) layer 102.

FIG. 2C provides a cross-section view of an example embodiment 240 where the tungsten oxide ($WO_3$) layer 222 has restricted any further etching of the underlying tungsten layer 102. As such, the tungsten oxide ($WO_3$) layer 222 effectively provides an etch stop.

As shown in FIGS. 2A-2C, therefore, the oxidation of the tungsten layer 102 by the oxygen plasma 202 inhibits or entirely restricts the subsequent application of a fluorine plasma 104 from etching the remaining tungsten layer 102. As such, the oxygen plasma 202 process can be used to generate an etch stop layer in the form of tungsten oxide 222 that provides an etch stop with respect to subsequent fluorine plasma etch processes.

FIGS. 3A-3H provide cross-section views of an example embodiment where atomic layer etch (ALE) of tungsten (W) is achieved through a sequential oxidation/reduction/removal process. For one embodiment, the selectivity of fluorine gas ($F_2$) plasma etching of tungsten (W) with respect to tungsten oxide ($WO_3$) is leveraged to achieve desired results. Further, the sequential oxidation/reduction/removal process can be repeated to etch the tungsten layer to a desired depth while leaving an etch stop layer when completed. Further, as described herein, the layer being etched can be a metal layer other than a tungsten layer while still taking advantage of the oxidation/reduction/removal techniques described herein. Further, as used herein, a metal layer (e.g., tungsten layer) is a layer of material that contains one or more metals (e.g., tungsten), consists essentially of one or more metals (e.g., tungsten), or consists of one or more metals (e.g., tungsten) while still taking advantage of the techniques described herein. For one embodiment, this layer of material to be etched is formed on a substrate for a microelectronic workpiece such as a semiconductor wafer. Other variations can be implemented.

Looking now to FIG. 3A, a cross-section view is provide of an example embodiment 300 where an oxygen ($O_2$) plasma 304 is applied to the surface of a tungsten (W) layer 302. This application of the oxygen plasma 304 oxidizes the surface of a tungsten (W) layer 302 to form tungsten oxide ($WO_3$) layer 312 as shown in FIG. 3B.

For one embodiment, the oxidation chemistry contains oxygen (O). In further embodiments, the oxidation chemistry contains O, $O_2$, $O_3$, excited oxygen, meta-stable oxygen, triplet oxygen, singlet oxygen, oxygen radical, or any combination of two or more thereof. In further embodiments, the oxidation chemistry includes an oxygen-containing plasma. In further embodiments, the oxidation chemistry is generated in a remote plasma source, and delivered to the substrate. Other oxidation chemistry and techniques can also be used while still taking advantage of the techniques described herein.

FIG. 3B provides a cross-section view of an example embodiment 310 for the tungsten oxide ($WO_3$) layer 312 that results from the oxidation in FIG. 3A. As depicted, a hydrogen ($H_2$) plasma 314 is then applied to reduce the tungsten oxide layer 312, while producing $H_2O$ and OH species (not shown). In particular, the surface of the tungsten oxide ($WO_3$) layer 312 is reduced by the hydrogen ($H_2$) plasma 314 to form a tungsten (W) surface layer 322 while leaving an underlying tungsten oxide ($WO_3$) layer 324 as shown in FIG. 3C. The hydrogen plasma 314 is preferably applied at a plasma energy less than 110 electron volts (eV) (e.g., $H_2$ plasma energy<110 eV). As shown in FIG. 4, this reduced energy application reduces and preferably eliminates sputtering of the tungsten (W). Further, the underlying tungsten oxide layer 324 left after this reduction is preferably a relatively thin layer.

For one embodiment, the reduction chemistry contains hydrogen (H). In further embodiments, the reduction chemistry contains H, $H_2$, excited hydrogen, meta-stable hydrogen, hydrogen radical, or any combination of two or more thereof. In further embodiments, the reduction chemistry includes a hydrogen-containing plasma. Other reduction chemistry and techniques can also be used while still taking advantage of the techniques described herein.

FIG. 3C provides a cross-section view of an example embodiment 320 for the surface tungsten (W) layer 322 formed by the $H_2$ plasma reduction of the FIG. 3B. As depicted, a fluorine ($F_2$) plasma 326 including fluorine gas ($F_2$) is applied to etch the tungsten surface layer 322. This application of fluorine plasma 326 produces tungsten fluoride ($WF_6$) gas 328, and the surface tungsten layer 322 is etched to reduce its height by an etch amount based upon the length of the additional etch cycle. Preferably, the fluorine plasma 326 is applied until the surface tungsten layer 322 is removed. The underlying tungsten oxide layer 324 provides an etch stop for this etch process to remove the surface tungsten layer 322.

For one embodiment, the etchant contains a halogen. In further embodiments, the etchant includes fluorine. In still further embodiments, the etchant includes F, $F_2$, another halogen, $CF_4$, $NF_3$, or any combination of two or more thereof. Other etchant chemistry and techniques can also be used while still taking advantage of the techniques described herein.

If a desired etch depth has been achieved with respect to the tungsten layer 302, the process can be stopped. The resulting structure would include the tungsten layer 302 and the tungsten oxide layer 324 as shown in FIG. 3D. However, if further etching is desired, then the oxidation, reduction, and removal process can be repeated.

FIG. 3D provides a cross-section view of an example embodiment 330 where an oxygen plasma 304 is again applied to further oxidize the tungsten layer 302 and expand the tungsten oxide layer 324. This further application of the oxygen plasma 304 oxidizes the surface of a tungsten (W) layer 302 underneath the tungsten oxide layer 324 to form a thicker tungsten oxide ($WO_3$) layer 342 as shown in FIG. 3E.

FIG. 3E provides a cross-section view of an example embodiment 340 for the thicker tungsten oxide ($WO_3$) layer 324 that results from the oxidation in FIG. 3D. As depicted and similar to FIG. 3B, a hydrogen ($H_2$) plasma 314 is applied to reduce the tungsten oxide layer 324, while producing $H_2O$ and OH species (not shown). In particular, the surface of the tungsten oxide layer 324 is reduced by the hydrogen plasma 314 to form a tungsten surface layer 352 while leaving an underlying tungsten oxide layer 354 as shown in FIG. 3F. As indicated above, the hydrogen plasma 314 is preferably applied at a plasma energy less than 110 electron volts (eV) (e.g., $H_2$ plasma energy<110 eV). Further, the underlying tungsten oxide layer 324 left after this reduction is preferably a relatively thin layer.

FIG. 3F provides a cross-section view of an example embodiment 350 for the surface tungsten layer 352 formed by the hydrogen plasma reduction of FIG. 3E. As depicted, a fluorine plasma 326 is applied to etch the tungsten surface layer 352. This application of fluorine plasma 326 produces tungsten fluoride ($WF_6$) gas 328, and the surface tungsten layer 352 is etched to reduce its height by an etch amount based upon the length of the additional etch cycle. Preferably, the fluorine plasma 326 is applied until the surface tungsten layer 352 is removed. The underlying tungsten oxide layer 354 provides an etch stop for this etch process to remove the surface tungsten layer 322.

FIG. 3G is a cross-section view of an example embodiment 360 as the fluorine plasma 326 is continued to be applied after the surface tungsten layer 352 in FIG. 3F has been removed. As indicated above, the tungsten oxide layer 354 provides an etch stop as the fluorine plasma 326 has a high etch selectivity with respect to tungsten over tungsten oxide.

If a desired etch depth has been achieved with respect to the tungsten layer 302, the process can be stopped. The resulting structure would include the tungsten layer 302 and the tungsten oxide layer 354 as shown in FIG. 3H. However, if further etching is desired, then the oxidation, reduction, and removal processes of FIGS. 3D-3G can be repeated until a desired etch depth has been achieved.

As indicated above, the steps of $O_2$ plasma oxidation, $H_2$ plasma reduction, and $F_2$ plasma etch can be repeated to provide the desired ALE of the original tungsten (W) layer.

As shown in FIGS. 3A-3H, therefore, oxidation, reduction, and etch process steps are applied to achieve ALE of tungsten. The steps of $O_2$ plasma oxidation, $H_2$ plasma reduction, and $F_2$ plasma etch can be repeated to provide a desired ALE of the original tungsten (W) layer and achieve target etch parameters.

As indicated above, a target etch rate less than or equal to ten (10) Angstroms per oxidation/reduction/etch cycle can be achieved, and preferably a target etch rate less than or equal to three (3) Angstroms per oxidation/reduction/etch cycle can be achieved. It is further noted that the oxidation, reduction, and etch/removal processes can be repeated to achieve a target etch depth for the tungsten (W) layer. This target etch depth can be, for example, less than or equal to 20 Angstroms and preferably less than or equal to 10 Angstroms.

FIG. 4 provides an embodiment 400 of representative diagrams for sputtering of tungsten (W) based upon the level of incident energy of deuterium ($H_2$ isotope). The horizontal axis 404 represents incident energy, and the scale is kilo electron volts (keV). The vertical axis 402 represents relative amounts of tungsten sputtering with respect to incident energy. The different data lines 406 represent different empirical or theoretical amounts of tungsten sputtering based upon incident energy. As shown, no detectable yield for sputtering of tungsten (W) is seen or expected for incident energy less than about 110 eV (i.e., $1.10 \times 10^{-1}$ keV).

Figure 5A:
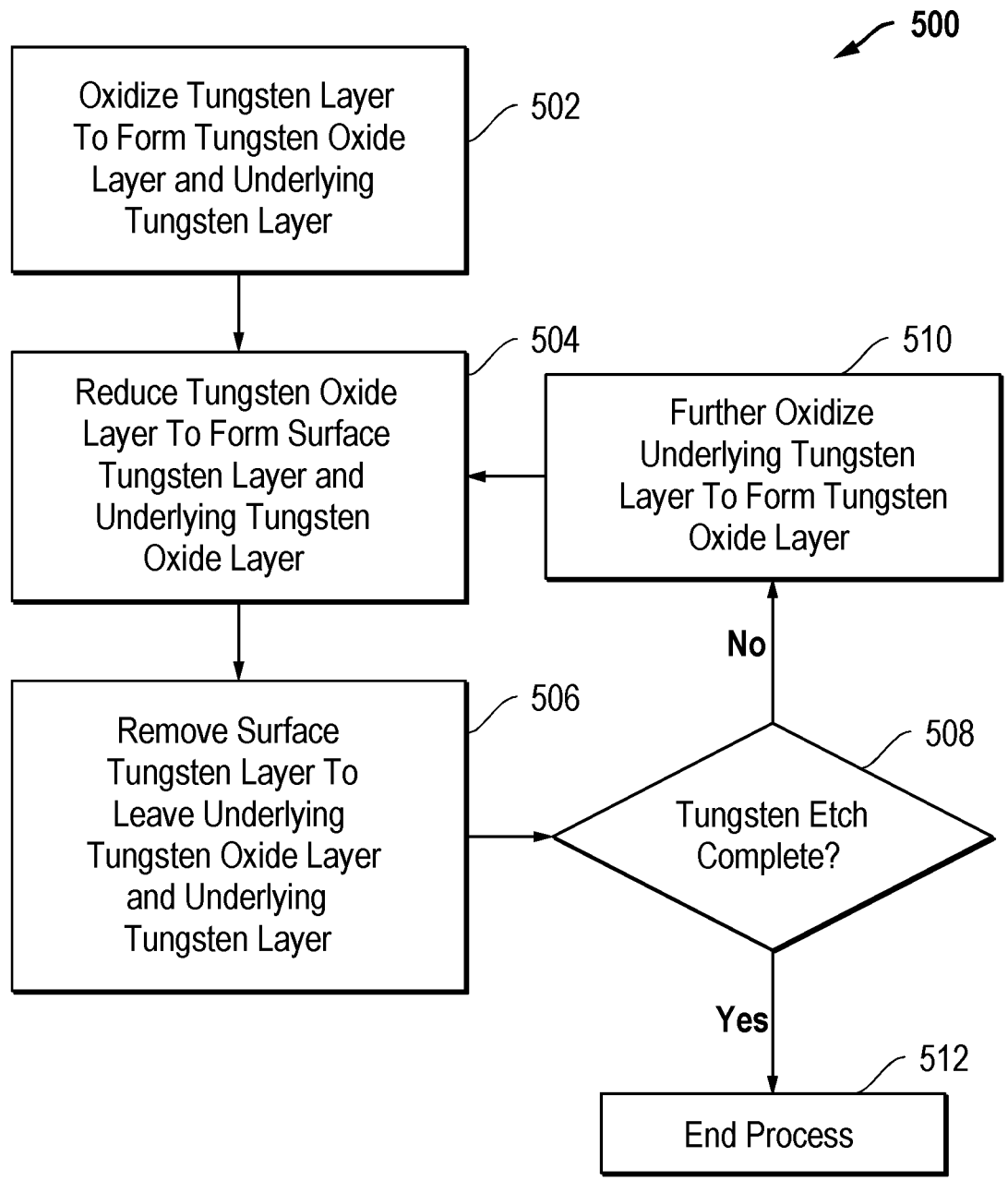
FIG. 5A is a process diagram of an example embodiment to etch a tungsten layer according to the techniques described herein.

FIG. 5A is a process diagram of an example embodiment 500 to etch a tungsten layer according to the techniques described herein. In block 502, a tungsten layer is oxidized to form a tungsten oxide layer and an underlying tungsten layer. For one embodiment, the tungsten layer is formed on a substrate for a microelectronic workpiece. In block 504, the tungsten oxide layer is then reduced to form a surface tungsten layer and an underlying tungsten oxide layer. In block 506, the surface tungsten layer is then removed to leave the underlying tungsten oxide layer and the tungsten layer. In block 508, a determination is then made whether the tungsten etch process has completed. For example, if a target depth for the etch has been achieved, then the determination in block 508 can be deemed "YES." The etch process can be completed and the process ended in block 512. If not complete and the determination in block 508 is "NO," then block 510 is reached where the underlying tungsten layer is further oxidized to form a tungsten oxide layer. The reducing of the tungsten oxide layer in block 504 and the removing of the resulting surface tungsten layer in block 506 are then repeated. A determination is again made in block 508 whether the etch process is complete. This oxidation, reduction, and removal process repeats until the etch is complete, and the etch process ends in block 512. For one embodiment, the oxidizing of the tungsten layer in blocks 502 and 510 is performed by applying a plasma including oxygen; the reducing of the tungsten oxide layer in block 504 is performed by applying a plasma including hydrogen; and the removing of the resulting surface tungsten layer in block 506 is performed by applying a plasma including fluorine. It is further noted that additional or different process steps could also be applied while still taking advantage of the techniques described herein.

Figure 5B:
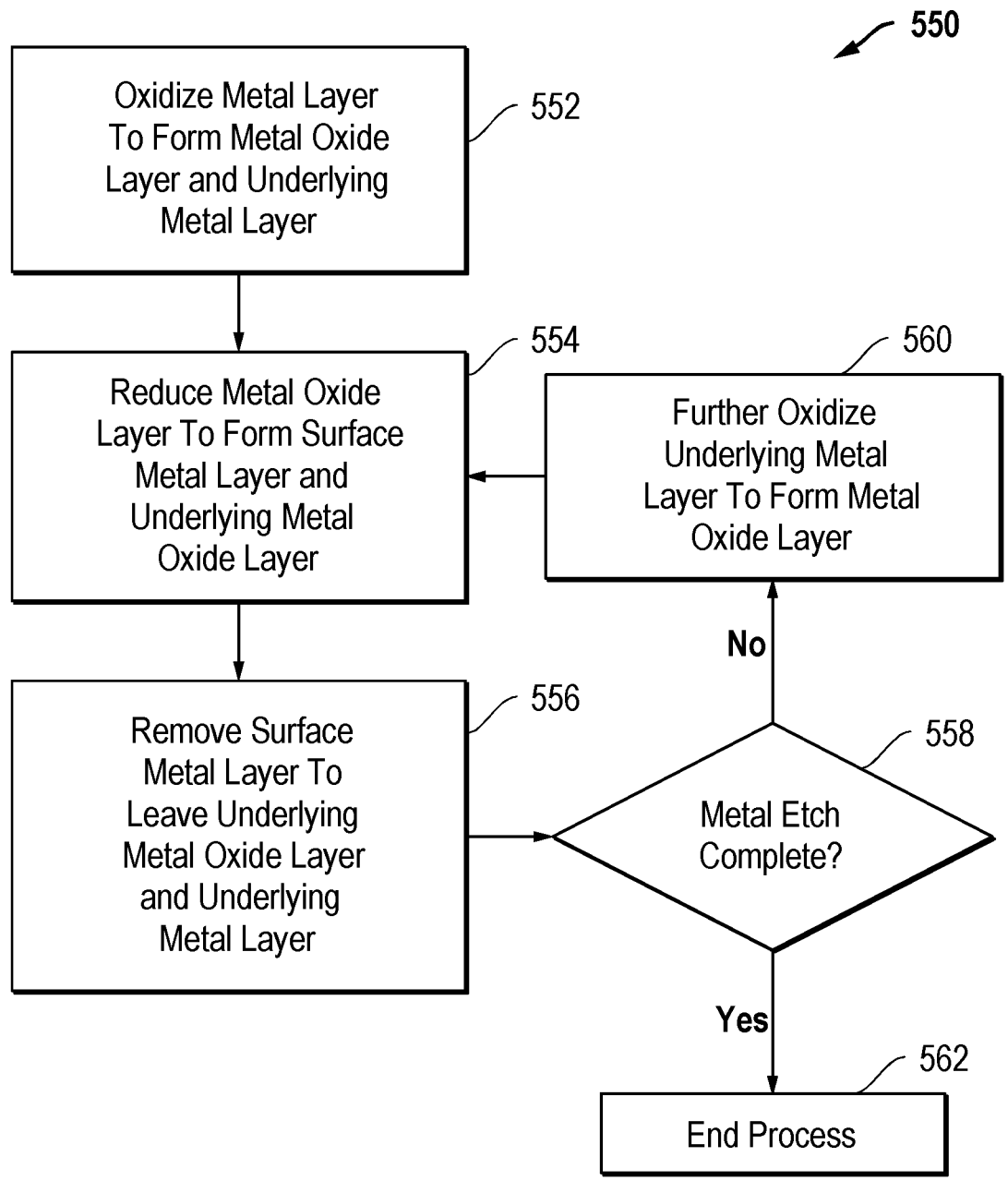
FIG. 5B is a process diagram of an example embodiment to etch a metal layer according to the techniques described herein.

FIG. 5B is a process diagram of an example embodiment 550 to etch a metal layer according to the techniques described herein. As described herein, the metal layer can be a metal layer other than a tungsten layer while still taking advantage of the oxidation, reduction, and removal techniques described herein. In block 552, a metal layer is oxidized to form a metal oxide layer and an underlying metal layer. For one embodiment, the metal layer is formed on a substrate for a microelectronic workpiece. In block 554, the metal oxide layer is then reduced to form a surface metal layer and an underlying metal oxide layer. In block 556, the surface metal layer is then removed to leave the underlying metal oxide layer and the metal layer. In block 558, a determination is then made whether the metal etch process has completed. For example, if a target depth for the etch has been achieved, then the determination in block 558 can be deemed "YES." The etch process can be completed and the process ended in block 562. If not complete and the determination in block 558 is "NO," then block 560 is reached where the underlying metal layer is further oxidized to form a metal oxide layer. The reducing of the metal oxide layer in block 554 and the removing of the resulting surface metal layer in block 556 are then repeated. A determination is again made in block 558 whether the etch process is complete. This oxidation, reduction, and removal process repeats until the etch is complete, and the etch process ends in block 562. For one embodiment, the oxidizing of the metal layer in blocks 552 and 560 is performed by applying a plasma including oxygen; the reducing of the metal oxide layer in block 504 is performed by applying a plasma including hydrogen; and the removing of the resulting surface metal layer in block 506 is performed by applying a plasma including fluorine. It is further noted that additional or different process steps could also be applied while still taking advantage of the techniques described herein.

Variations in the above technique can also be implemented. For example, the oxidation reactions can be achieved using $O_2$ and $O_3$ plasma. Reduction can be implemented using CO, NO, or other gases in addition to or instead of $H_2$. Further, as indicated above, similar etch techniques as described with respect to FIGS. 1A-1C, 2A-2C, 3A-3E, 4, and 5A can be more applied to layers made from other metals or combinations of metals in addition to tungsten (W) layers, as provided in FIG. 5B. For example, silicon (Si) is a metal material that can be etched using these techniques. Different etchants can also be used depending upon the material being etched and the selectivity provided by the etchant. For example, HBr can be used as an etchant for $Si/SiO_2$.

It is further noted that the oxidation/reduction techniques described herein are generally applicable to other materials and reducing/oxidizing agents where target depths and selectivity of reduced/oxidized materials are attained.

For one embodiment, a method of etching includes receiving a substrate having a metal layer, the metal layer including an exposed surface treatable by a chemical environment and selectively etching the metal layer using a sequence of chemical exposures. The chemical exposures include exposing the metal layer to an oxidation chemistry to form a metal oxidation sub-layer extending beneath the exposed surface to a first target depth within the metal layer, exposing the metal layer to a reduction chemistry to reduce a portion of the metal oxidation sub-layer and form a metal reduction sub-layer extending beneath the exposed surface to a second target depth less than the first target depth, and exposing the metal layer to an etchant to fully remove the metal reduction sub-layer. As described above, for one embodiment the metal layer contains tungsten. For further embodiments, the metal layer consists essentially of tungsten.

For one embodiment, the method also includes repeating the sequence of chemical exposures until a target etch depth is achieved. In one further embodiment, the first target depth is less than 10 Angstrom. In additional embodiments, at least one of the chemical exposures is a gas-phase exposure. In further embodiments, all of the chemical exposures are a gas-phase exposure. In still further embodiments, all of the chemical exposures are performed in the same chamber.

For one embodiment, the oxidation chemistry contains oxygen (O). In further embodiments, the oxidation chemistry contains O, $O_2$, $O_3$, excited oxygen, meta-stable oxygen, triplet oxygen, singlet oxygen, oxygen radical, or any combination of two or more thereof. In further embodiments, the oxidation chemistry includes an oxygen-containing plasma. In further embodiments, the oxidation chemistry is generated in a remote plasma source, and delivered to the substrate. In additional embodiments, the reduction chemistry contains hydrogen (H). In further embodiments, the reduction chemistry contains H, $H_2$, excited hydrogen, metastable hydrogen, hydrogen radical, or any combination of two or more thereof. In further embodiments, the reduction chemistry includes a hydrogen-containing plasma. In additional embodiments, the etchant contains a halogen. In further embodiments, the etchant includes fluorine. In still further embodiments, the etchant includes F, $F_2$, another halogen, $CF_4$, $NF_3$, or any combination of two or more thereof.

For one embodiment, the reduction chemistry is generated in a remote plasma source, and delivered to the substrate. In additional embodiments, the method also includes controlling a first ion energy level for a first ion flux incident on the substrate during the exposure to the oxidation chemistry and controlling a second ion energy level for a second ion flux incident on the substrate during the exposure to the reduction chemistry, where a ratio of the first ion energy level to the second energy level exceeds ten (e.g., (first ion energy level)/(second ion energy level)>10).

Different and additional processes and process materials can also be implemented while still taking advantage of the techniques described to etch material layers including or consisting essentially of tungsten, another metal, or combinations thereof.

It is further noted that the techniques described herein may be utilized with a wide range of plasma processing systems. For example, the techniques may be utilized with plasma etch process systems, plasma deposition process systems or any other plasma process system.

Figure 6:
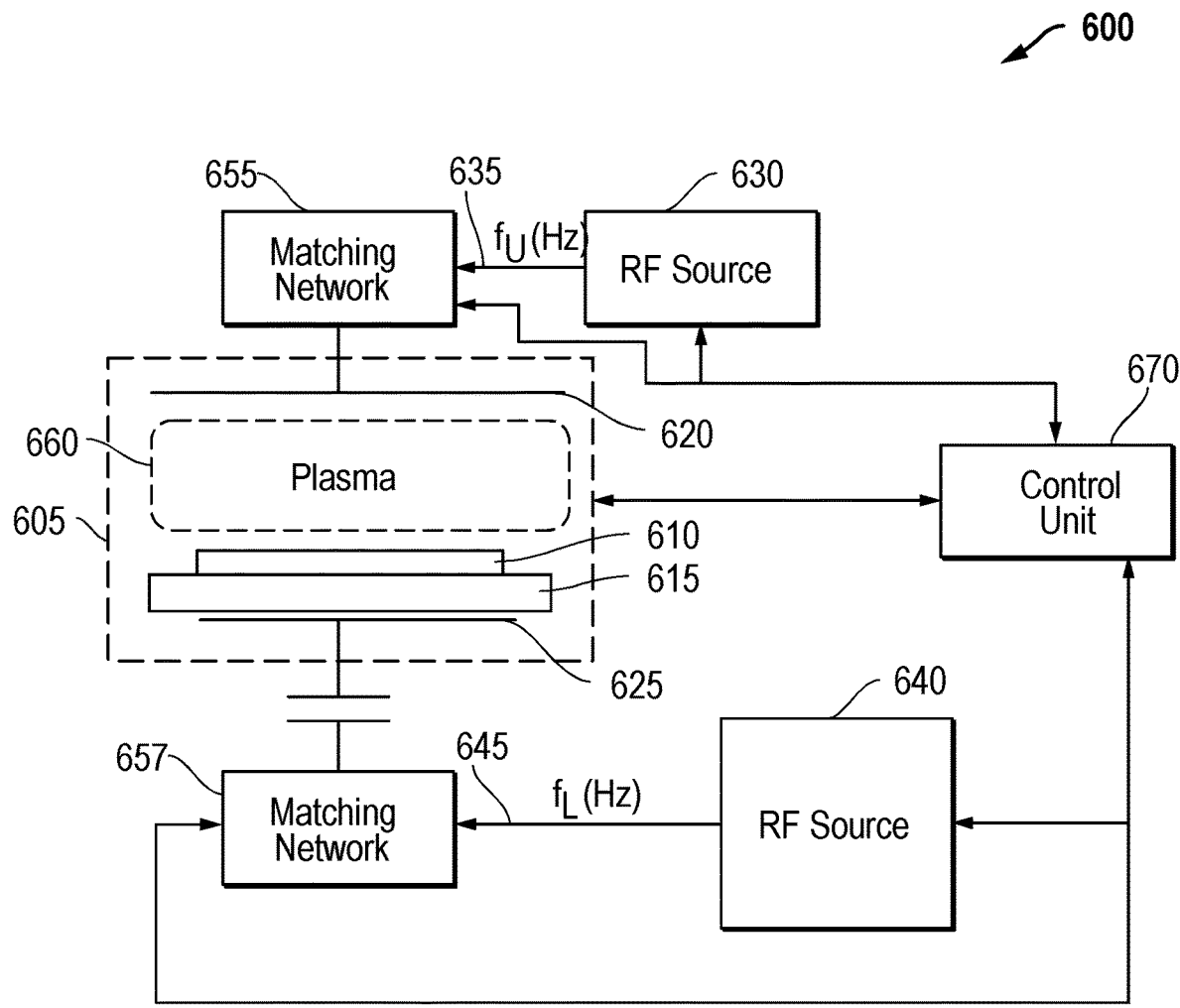
FIG. 6 is a diagram of an example embodiment for a plasma processing system that can be used with respect to the processing techniques described herein.

FIG. 6 provides one example embodiment for a plasma processing system 600 that can be used with respect to the processing techniques described herein and is provided only for illustrative purposes. The plasma processing system 600 may be a capacitively coupled plasma processing apparatus, inductively coupled plasma processing apparatus, microwave plasma processing apparatus, surface wave plasma operating at radio frequencies, electron cyclotron resonance (ECR) plasma processing apparatus, or other type of processing system or combination of systems. Thus, it will be recognized by those skilled in the art that the techniques described herein may be utilized with any of a wide variety of plasma processing systems. The plasma processing system 600 can be used for a wide variety of operations including, but not limited to, etching, deposition, cleaning, plasma polymerization, plasma-enhanced chemical vapor deposition (PECVD), atomic layer deposition (ALD) and so forth. The structure of a plasma processing system 600 is well known, and the particular structure provided herein is merely of illustrative purposes. It will be recognized that different and/or additional plasma process systems may be implemented while still taking advantage of the techniques described herein.

Looking in more detail to FIG. 6, the plasma processing system 600 may include a process chamber 605. As is known in the art, process chamber 605 may be a pressure controlled chamber. A substrate 610 (in one example a semiconductor wafer) may be held on a stage or chuck 615. An upper electrode 620 and a lower electrode 625 may be provided as shown. The upper electrode 620 may be electrically coupled to an upper RF source 630 through an upper matching network 655. The upper RF source 630 may provide an upper frequency voltage 635 at an upper frequency ($f_U$). The lower electrode 625 may be electrically coupled to a lower RF source 640 through a lower matching network 657. The lower RF source 640 may provide a lower frequency voltage 645 at a lower frequency ($f_L$). Though not shown, it will be known by those skilled in the art that a voltage may also be applied to the chuck 615.

Components of the plasma processing system 600 can be connected to, and controlled by, a control unit 670 that in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. It will be recognized that since control unit 670 may be coupled to various components of the plasma processing system 600 to receive inputs from and provide outputs to the components.

The control unit 670 can be implemented in a wide variety of manners. For example, the control unit 670 may be a computer. In another example, the control unit may be comprised off one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g., memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

In operation, the plasma processing apparatus uses the upper and lower electrodes to generate a plasma 660 in the process chamber 605 when applying power to the system from the upper RF source 630 and the lower RF source 640. Further, as is known in the art, ions generated in the plasma 660 may be attracted to the substrate 610. The generated plasma can be used for processing a target substrate (such as substrate 610 or any material to be processed) in various types of treatments such as, but not limited to, plasma etching, chemical vapor deposition, treatment of semiconductor material, glass material and large panels such as thin-film solar cells, other photovoltaic cells, and organic/inorganic plates for flat panel displays, etc.

Application of power results in a high-frequency electric field being generated between the upper electrode 620 and the lower electrode 625. Processing gas delivered to process chamber 605 can then be dissociated and converted into a plasma. As shown in FIG. 6, the exemplary system described utilizes both upper and lower RF sources. For example, high-frequency electric power, for an exemplary capacitively coupled plasma system, in a range from about 3 MHz to 150 MHz may be applied from the upper RF source 630 and a low frequency electric power in a range from about 0.2 MHz to 40 MHz can be applied from the lower RF source. It will be recognized that the techniques described herein may be utilized with in a variety of other plasma systems. In one example system, the sources may switched (higher frequencies at the lower electrode and lower frequencies at the upper electrode). Further, a dual source system is shown merely as an example system and it will be recognized that the techniques described herein may be utilized with other systems in which a frequency power source is only provided to one electrode, direct current (DC) bias sources are utilized, or other system components are utilized, etc.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD (critical dimension) target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to etch a metal layer, comprising:
  receiving a substrate having a metal layer, the metal layer having an exposed surface;
  oxidizing the metal layer to form a metal oxide layer extending beneath the exposed surface to a first depth and an underlying metal layer;
  reducing a portion of the metal oxide layer to form a surface metal layer extending beneath the exposed surface to a second depth and an underlying metal oxide layer, wherein the second depth is less than the first depth; and
  removing the surface metal layer to leave the underlying metal oxide layer and the underlying metal layer.

2. The method of claim 1, wherein the metal layer is formed on a substrate for a a microelectronic workpiece.

3. The method of claim 1, further comprising oxidizing the underlying metal layer to form a metal oxide layer, and then repeating the reducing and removing steps.

4. The method of claim 3, wherein the oxidizing, reducing, and removing steps are repeated to achieve a target etch depth.

5. The method of claim 3, wherein a target etch rate is achieved for each process cycle of oxidizing, reducing, and removing.

6. A method to etch a tungsten layer, comprising:
oxidizing a tungsten layer to form a tungsten oxide layer and an underlying tungsten layer;
reducing the tungsten oxide layer to form a surface tungsten layer and an underlying tungsten oxide layer; and
removing the surface tungsten layer to leave the underlying tungsten oxide layer and the underlying tungsten layer.

7. The method of claim 6, wherein the removing comprises an etch process, and wherein the underlying tungsten layer provides an etch stop for the etch process.

8. The method of claim 6, further comprising oxidizing the underlying tungsten layer to increase the tungsten oxide layer, and then repeating the reducing and removing steps.

9. The method of claim 8, wherein the oxidizing, reducing, and removing steps are repeated to achieve a target etch depth.

10. The method of claim 9, wherein the target etch depth is less than or equal to 20 Angstroms.

11. The method of claim 9, wherein a target etch rate less than or equal to 10 Angstroms or a target etch rate less than or equal to 3 Angstroms is achieved for each process cycle of oxidizing, reducing, and removing.

12. The method of claim 6, wherein the oxidizing comprises applying a plasma comprising oxygen to the tungsten layer, wherein the reducing comprises applying a plasma comprising hydrogen to the tungsten oxide layer, and wherein the removing comprises applying a plasma comprising fluorine.

13. A method of etching, comprising:
receiving a substrate having a metal layer, the metal layer including an exposed surface treatable by a chemical environment; and
selectively etching the metal layer using a sequence of chemical exposures, the chemical exposures including:
exposing the metal layer to an oxidation chemistry to form a metal oxidation sub-layer extending beneath the exposed surface to a first target depth within the metal layer,
exposing the metal layer to a reduction chemistry to reduce a portion of the metal oxidation sub-layer and form a metal reduction sub-layer extending beneath the exposed surface to a second target depth less than the first target depth, and
exposing the metal layer to an etchant to fully remove the metal reduction sub-layer.

14. The method of claim 13, further comprising repeating the sequence of chemical exposures until a target etch depth is achieved.

15. The method of claim 13, wherein one or more of the chemical exposures is a gas-phase exposure.

16. The method of claim 13, wherein all of the chemical exposures are performed in the same chamber.

17. The method of claim 13, wherein the metal layer contains tungsten.

18. The method of claim 13, wherein the metal layer consists essentially of tungsten.

19. The method of claim 13, wherein the oxidation chemistry contains O, $O_2$, $O_3$, excited oxygen, meta-stable oxygen, triplet oxygen, singlet oxygen, oxygen radical, or any combination of two or more thereof.

20. The method of claim 13, wherein the reduction chemistry contains H, $H_2$, excited hydrogen, meta-stable hydrogen, hydrogen radical, or any combination of two or more thereof.

21. The method of claim 13, wherein the etchant contains a F, $F_2$, another halogen, $CF_4$, $NF_3$, or any combination of two or more thereof.

22. The method of claim 13, wherein the oxidation chemistry includes an oxygen containing plasma and the reduction chemistry includes a hydrogen containing plasma.

23. The method of claim 13, further comprising:
controlling a first ion energy level for a first ion flux incident on the substrate during the exposure to the oxidation chemistry; and
controlling a second ion energy level for a second ion flux incident on the substrate during the exposure to the reduction chemistry,
wherein a ratio of the first ion energy level to the second energy level exceeds ten.

* * * * *